(12) United States Patent
Kwon et al.

(10) Patent No.: US 6,677,555 B2
(45) Date of Patent: Jan. 13, 2004

(54) OPTICAL DEVICE MODULE USING INTEGRAL HEAT TRANSFER MODULE

(75) Inventors: Oh-Dal Kwon, Suwon-shi (KR); Sun-Tae Jung, Anyang-shi (KR); Tae-Gyu Kim, Yongin-shi (KR)

(73) Assignee: Samsung Electronics Co., Ltd., Suwon (KR)

(*) Notice: Subject to any disclaimer, the term of this patent is extended or adjusted under 35 U.S.C. 154(b) by 187 days.

(21) Appl. No.: 09/935,825

(22) Filed: Aug. 23, 2001

(65) Prior Publication Data

US 2002/0101891 A1 Aug. 1, 2002

(30) Foreign Application Priority Data

Jan. 30, 2001 (KR) .......................................... 2001-4279

(51) Int. Cl.[7] ................................................. H05B 3/00
(52) U.S. Cl. ....................... 219/209; 219/210; 219/530; 219/540; 219/544; 62/3.2; 62/3.7
(58) Field of Search ................................ 219/209, 210, 219/521, 530, 540, 544, 546, 444.1, 538; 338/311, 314; 165/80.4; 62/3.2, 3.3, 3.6, 3.7, 259.2; 250/335; 372/36

(56) References Cited

U.S. PATENT DOCUMENTS

| | | | | |
|---|---|---|---|---|
| 3,940,621 A | * | 2/1976 | Fletcher et al. | 250/335 |
| 4,739,382 A | * | 4/1988 | Blouke et al. | 219/209 |
| 5,070,936 A | * | 12/1991 | Carroll et al. | 165/80.4 |
| 5,363,391 A | * | 11/1994 | Matthews et al. | 372/36 |
| 5,522,225 A | | 6/1996 | Eskandari | |
| 5,523,563 A | * | 6/1996 | Moessner | 62/259.2 |
| 6,043,982 A | | 3/2000 | Meissner | |
| 6,091,837 A | | 7/2000 | Dinh | |
| 6,098,408 A | | 8/2000 | Levinson | |
| 6,184,504 B1 | * | 2/2001 | Cardella | 219/209 |
| 6,298,669 B1 | * | 10/2001 | Maruyama et al. | 62/3.2 |
| 6,384,383 B2 | * | 5/2002 | Kano et al. | 219/444.1 |
| 6,384,385 B1 | * | 5/2002 | Puleo | 219/210 |
| 6,449,960 B1 | * | 9/2002 | Kwon et al. | 62/3.7 |
| 6,475,606 B2 | * | 11/2002 | Niwa | 219/538 |

FOREIGN PATENT DOCUMENTS

EP 99120915.6 10/1999 ........... H01S/3/042

* cited by examiner

*Primary Examiner*—Sang Y. Paik
*Assistant Examiner*—Fadi H. Dahbour
(74) *Attorney, Agent, or Firm*—Cha & Reiter

(57) ABSTRACT

An optical device module using an integral heat transfer module. The heat transfer module has an integrally formed heat source and a temperature sensor for reading temperature. A heat transfer path is simplified in packaging the optical device module, so that the optical device can avoid performance degradation due to nonuniform temperature distribution. The amount power consumption can be reduced and excellent workability can be ensured.

14 Claims, 6 Drawing Sheets

OPTICAL DEVICE MODULE USING INTEGRAL HEAT TRANSFER MODULE

PRIORITY

This application claims priority to an application entitled "OPTICAL DEVICE MODULE USING INTEGRAL HEAT TRANSFER MODULE" applied with the Korean Industrial Property Office on Jan. 30, 2001 and assigned Serial No. 2001-4279, the contents of which is hereby incorporated by reference.

BACKGROUND OF THE INVENTION

1. Field of the Invention

The present invention generally relates to a technique of manufacturing an optical device module which requires temperature control. More particularly, the present invention relates to an optical device module having a heat transfer medium for overcoming nonuniform temperature distribution.

2. Description of the Related Art

In manufacturing an optical device, it is required to control temperature for the stability of wavelength. Also, the temperature gradient in the optical device causes optical loss as well as wavelength variation. Thus, temperature should be uniformly distributed across the whole device. Accordingly, in the prior art, designs of a heat source and a heat dispersing plate have been considered important features.

A basic prior art method of controlling temperature of the optical device uses the optical device, the heat source and a heat detecting sensor. The heat source and the heat detecting sensor are contacted with the surface of the optical device, and the sensor reads the surface temperature of the device for feedback control.

However, according to the above-mentioned prior art method, temperature distribution of the heat source and temperature fluctuates due to unstable current in the heat source. In order to stabilize the current, a heat transfer plate is installed between the heat source and the device. The transmission of heat flows from the heat source to the device through the heat transfer plate, and the temperature sensor between the heat transfer plate, and the device detects temperature for feedback control.

FIG. 1 is a schematic perspective view for illustrating such a prior art optical device module, and FIG. 2 is a side structural view of the optical device module shown in FIG. 1.

Referring to FIG. 2, a typical optical device module is comprised of an optical device 100 which requires temperature control, a temperature sensor 110, a heat source 130, a housing 140 and a mount 141. In addition, although not shown in the drawings, lead wires are provided to apply voltage or current for heating the heat source.

The thermal contact resistance has the greatest difference according to the amount of contact among the heat source 130, the heat transfer plate 120 and the optical device 100. A medium, such as thermal grease, solder and the like, is applied to maintain close contact. In order to obtain the most efficient use of the medium, the contact surfaces should be rubbed for uniform distribution.

However, there are instances when uniform contact still cannot be obtained even with a rubbed contact surfaces containing a medium. In such a case, the temperature is not uniformly dispersed across the whole area of the heat transfer plate 120, so that temperature distribution is frequently nonuniform across the device.

Also, the temperature sensor 110 is generally applied as a thermistor or resistance temperature detector (RTD), in which the temperature sensor 110 is preferably arranged adjacent the optical device 100 for more accurate temperature detection of the optical device 100. Here, the temperature sensor 110 generally has a certain amount of thickness, and thus essentially builds up an insulation layer between the optical device 100 and the heat transfer plate 120 when placed between the optical device 100 and the heat transfer plate 120 as shown in FIG. 2.

As described above, the optical device module of the prior art does not provide complete contact among the parts, thereby causing temperature distribution to be nonuniform and efficiency to be degraded. Accordingly, the wavelength features of the optical device are degraded, the optical device can be damaged, and power consumption is increased.

SUMMARY OF THE INVENTION

The present invention has been proposed to solve the foregoing problems of the prior art. The present invention provides an optical device module having excellent workability in which a heat transfer path is simplified by the packaging the optical device module. The present invention permits the optical device to avoid performance degradation due to nonuniform temperature distribution. In addition, in the present invention, power consumption can be reduced over devices in the prior art.

According to an embodiment of the invention,, it is provided that an optical device module using integral heat transfer module comprises a heat transfer module attached to an optical device and having a heat source for heating, and a temperature sensor for sensing temperature. The heat source and the temperature sensor are integrally formed.

DETAILED DESCRIPTION OF THE PREFERRED EMBODIMENT

Figure 1:
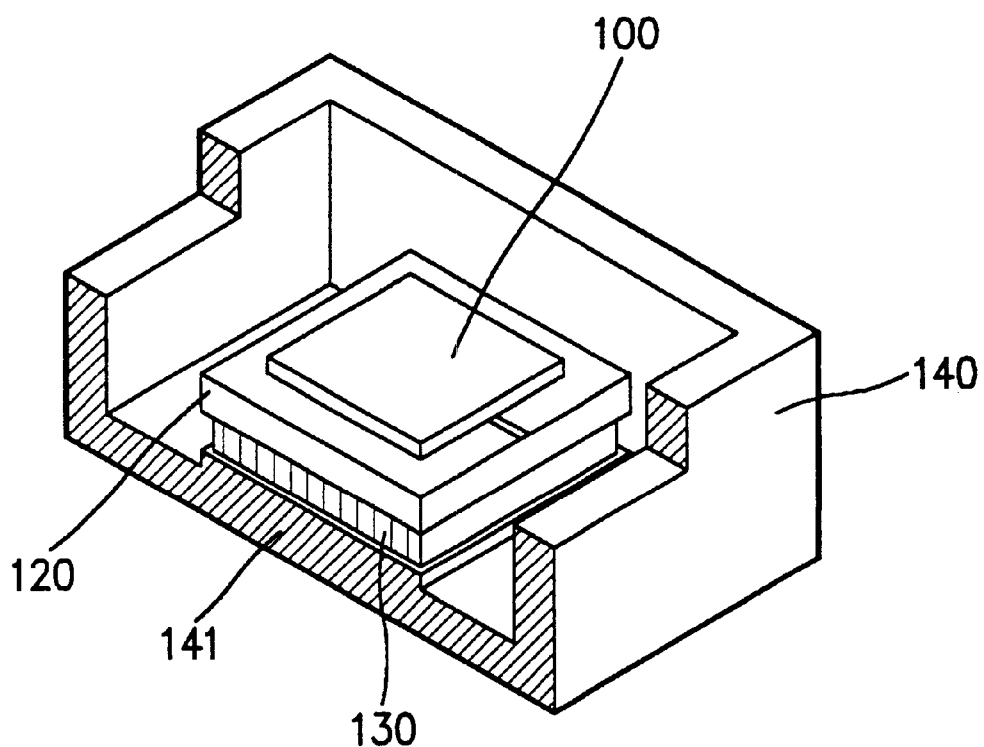
FIG. 1 is a schematic perspective view for illustrating a typical prior art optical device module.
Figure 2:
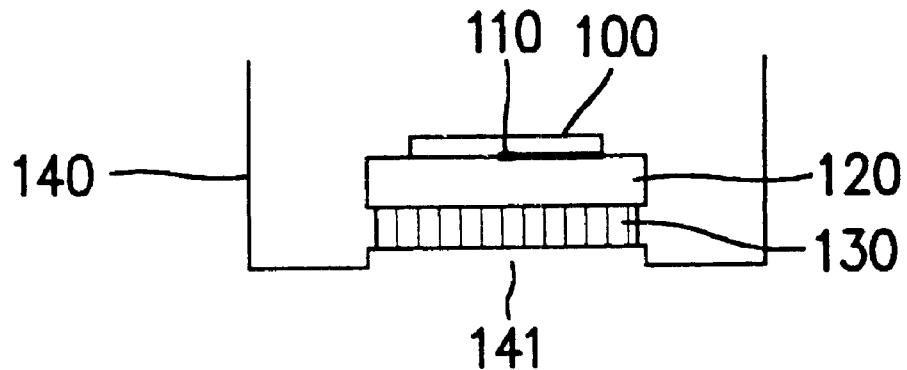
FIG. 2 is a side structural view of the optical device module shown in FIG. 1.
Figure 3:
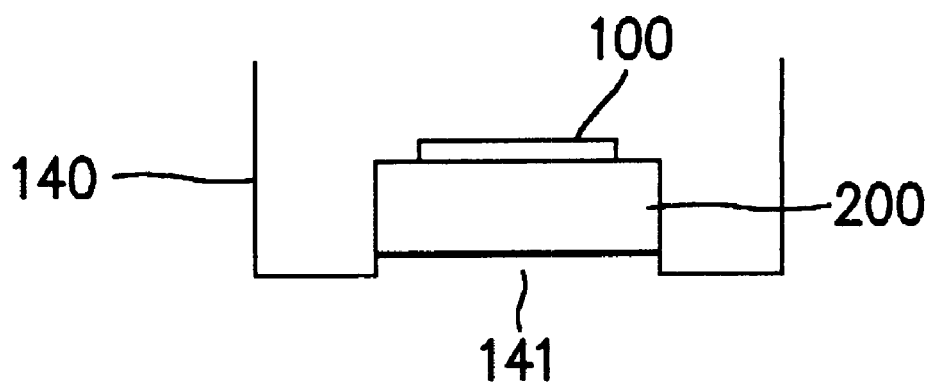
FIG. 3 is a side elevation view of an optical device module having an integral heat transfer module according to an embodiment of the invention.

FIG. 3 is a side elevation view of an optical device module having an integral heat transfer module according to an embodiment of the invention.

Referring to FIG. 3, the optical device module of the invention is generally comprised of an optical device 100 which requires temperature control, a heat transfer module 200 and a housing 140. The optical device 100 is attached to a heat transfer module 200 via a medium such as thermal grease.

The heat transfer module 200 is provided according to the characteristics of the invention, and has an outer housing acting as a heat transfer plate of the related art, a heat source capable of heating and a temperature sensor for detecting temperature which are integrally provided. Also, lead wires (not shown) provide the temperature sensor and the heat source with supply voltage and current.

Such an integral heat transfer module 200 is used to minimize contact portions of each part of the related art to increase simplification of a heat transfer path. A structure of such an integral heat transfer module 200 will be described in more detail in reference to the accompanying drawings.

Figure 4:
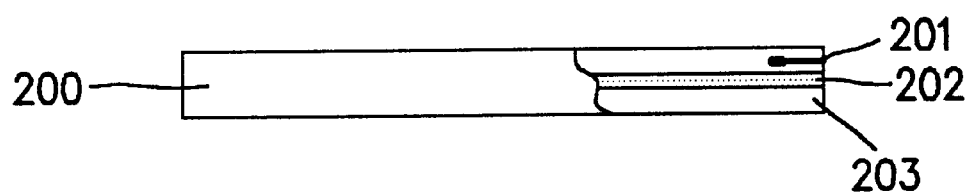
FIG. 4 is a structural view of an integral heat transfer module in the optical device module shown in FIG. 3 according to a first embodiment of the invention.

FIG. 4 is a cross section of an integral heat transfer module in the optical device module shown in FIG. 3 according to the first embodiment of the invention, the integral heat transfer module 200 employing a heater as the heat source.

Referring to FIG. 4, a temperature sensor 201 is provided in the inner upper part of an outer housing 203 of the integral heat transfer module 200, and a heater 202 is provided under the temperature sensor 201. In this case, the heater 202 can utilize ceramics or hot wires, in which a ceramic heater requires to be attached through soldering after metal plating.

Figure 5:
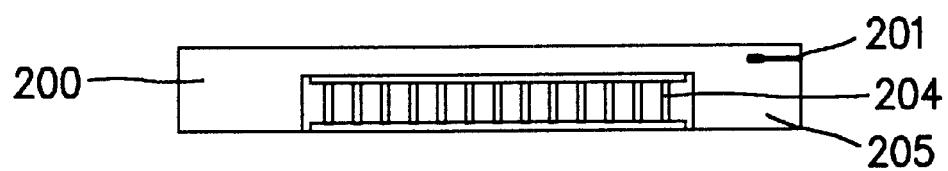
FIG. 5 is a structural view of an integral heat transfer module in the optical device module shown in FIG. 3 according to the a embodiment of the invention.

FIG. 5 is a cross sectional view of an integral heat transfer module of the optical device module shown in FIG. 3 according to the second embodiment of the invention. In this embodiment, the integral heat transfer module 200 employs a temperature electric cooler (TEC) 204 as the heat source.

Referring to FIG. 5, a temperature sensor 201 is provided in the inner upper part of an outer housing 205 of the integral heat transfer module 200, and a heater 202 is provided under the temperature sensor 201.

The TEC 204 is constituted as a module of n and p type thermoelectric semiconductors connected electrically in series and thermally in parallel, in which a temperature difference takes place at both sides of the module due to thermoelectric effect when a DC current is applied. As shown in FIG. 5, it is preferred that solder is attached to the upper surface of the TEC 204 and the lower surface is isolated from the outer housing.

Figure 6A:
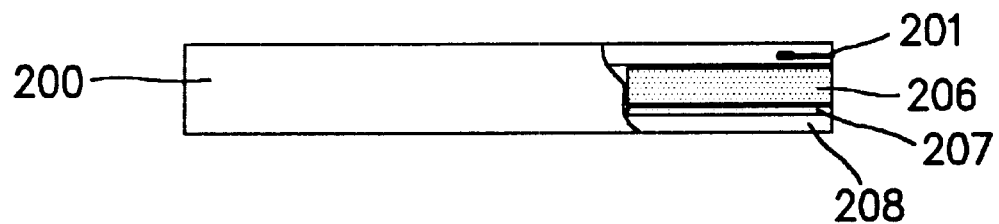
FIGS. 6A and 6B are structural views of integral heat transfer modules in the optical device module shown in FIG. 3 according to a third embodiment of the invention.
Figure 6B:
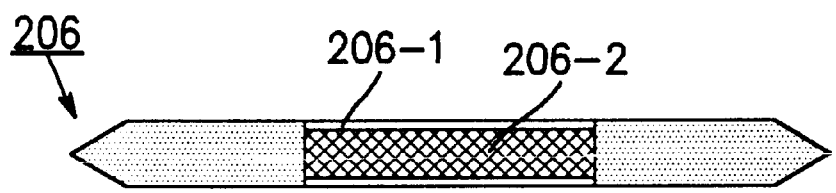

FIGS. 6A and 6B are structural views of integral heat transfer modules in the optical device module shown in FIG. 3 according to the third embodiment of the invention.

Referring to FIGS. 6A and 6B, a temperature sensor 201 is provided in the inner upper part of an outer housing 208 of the integral heat transfer module 200, four or five heat pipes 206 are provided under the temperature sensor 201, and a heat source 207 is provided under the heat pipes 206.

In general, each of the heat pipes 206 internally contains a work fluid in a sealed vessel and utilizes latent heat in which the work fluid transfers heat between both ends of the vessel via phase transformation between gas and liquid phases. This scheme provides heat transfer performance which is much more efficient when compared to typical heat transfer devices using work fluids of single phase.

As shown in FIG. 6B, each heat pipe 206 is comprised of the sealed pipe 206-1, the work fluid and wicks 206-2 inside the vessel. The heat pipes are variously classified according to structure type of the wicks 206-2, scheme of returning fluid, geometry of the inside, working temperature and the like. The sealed vessel 206-1 and the wicks 206-2 are provided to constitute the each of the heat pipes 206. Here, the outer housing of the heat transfer module 200 preferably utilizes a material excellent in heat conductivity.

The integral heat transfer module 200 as shown in FIGS. 4 to 6B can be attached to the optical device 100 as shown in FIG. 3, and then fixed to the mount 141 of the housing 140. Here, four electric wires are required including two wires for the temperature sensor and two wires for the heat source. These four electric wires are pin-treated. Pin holes are formed in portions corresponding to the four pins of the housing 140 so that the pins and the holes fit together. Temperature is monitored and controlled by using these four pins.

The optical device module of the invention can be obtained by using the integral heat transfer module configured as above.

In foregoing the optical device module using the integral heat transfer module of the invention, the heat transfer module integrally has the heat source and the temperature sensor for reading temperature. Then, the heat transfer path is simplified in packaging the optical device module so that the optical device can avoid performance degradation due to nonuniform temperature distribution, power consumption thereof can be reduced and excellent workability can be ensured.

While the invention has been described about the specific embodiment thereof, a number of modifications and variations may be made without departing the scope of the invention. Therefore, the scope of the invention is not restricted by the foregoing embodiment, but will be defined by the appended claims and the equivalents thereof.

What is claimed is:

1. An optical device module comprising:

an optical device which requires temperature control; and an integrally formed heat transfer module attached to said optical device, said integrally formed heat transfer module including a heat source and a temperature sensor for reading temperature wherein said heat source includes one of ceramics, hot wires, a temperature electric cooler (TEC), and a heat pipe.

2. An optical device module according to claim 1, wherein said temperature sensor and said heat source comprises electric wires which are pin treated.

3. An optical device according to claim 2, wherein said heat transfer module comprises an outer housing having pin holes formed therein which correspond to the pin-treated electric wires.

4. An optical device module according to claim 1, wherein said heat module further comprises an outer housing in which said temperature sensor is arranged, and said heat source is arranged in contact with a bottom surface of said temperature sensor.

5. An optical device module according to claim 1, further comprising an outer housing in which said temperature sensor is arranged on an upper portion of said outer housing, and wherein said heat source comprises a ceramic heater arranged contact with a bottom surface of said temperature sensor.

6. An optical device module according to claim 5, further comprising attachment of said ceramic heater is attached to said one of ceramics and hot wires by metal plating.

7. An optical device module according to claim 1, wherein said TEC comprises a module of n and p thermoelectric semiconeductors electrically connected in series, and thermally connected in parallel; and wherein solder is attached to an upper surface of said TEC;

said heat transfer module comprises an outer housing; and a lower surface of said TEC is isolated from said outer housing.

8. A method for manufacturing an optical d vice module comprising the steps of:
(a) providing an optical device which requires temperature control
(b) integrally forming a heat transfer module attached to said optical device including a heat source and a temperature sensor for reading temperature which are integral y formed;
(c) providing an outer housing having an upper portion in which said temperature sensor is arranged, and said heat source is arranged in contact with a bottom surf e of said temperature
(d) providing a plurality of heat pipes arranged below said temperature sensor, and said heat source being provided below the heat pipes and arranged on a lower portion of said outer housing.

9. An optical device module comprising:
an optical device which requires temperature control; and
an integrally formed heat transfer module attached to said optical device, said integrally formed heat transfer module including a heat source and a temperature sensor for reading temperature, wherein said temperature sensor and said heat source comprise electric wires which are pin treated.

10. An optical device module according to claim 9, wherein id heat source further comprises a temperature electric cooler (TEC).

11. An optical device module according to claim 10, wherein said TEC comprises a module of n and p thermoelectric semiconductors electrically connected in series, and thermally connected in parallel; and wherein solder is attached to an upper surface of said TEC;

said heat transfer module comprises an outer housing; and a lower surface of said TEC is isolated from said outer housing.

12. An optical device module according to claim 9, wherein aid heat module further comprises an outer housing in which said temperature sensor is arranged, and said heat source is arranged in contact with a bottom surface of said temperature sensor.

13. An optical device module according to claim 9, further comprising an outer housing in which said temperature sensor is arranged on an upper portion of aid outer housing, and wherein said heat source comprises a ceramic heater arranged in contact th a bottom surface of said temperature sensor.

14. An optical device according to claim 9, wherein said heat transfer module comprises an outer housing having pin holes formed therein which correspond to the pin-treated electric wires.

* * * * *